United States Patent
Akiba et al.

(12) 
(10) Patent No.: US 6,261,648 B1
(45) Date of Patent: *Jul. 17, 2001

(54) PLASMA FACING COMPONENTS OF NUCLEAR FUSION REACTORS EMPLOYING TUNGSTEN MATERIALS

(75) Inventors: Masato Akiba; Kazuyuki Nakamura, both of Ibaraki-ken; Akira Ichida; Takehiko Hayashi, both of Toyama-ken, all of (JP)

(73) Assignees: Japan Atomic Energy Research Institute; Tokyo Tungsten Co., Ltd., both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/388,819

(22) Filed: Feb. 15, 1995

(30) Foreign Application Priority Data

Feb. 15, 1994 (JP) .................................................... 6-039256

(51) Int. Cl.$^7$ ................................ C23C 8/00; G21B 1/00
(52) U.S. Cl. ............................................. 427/585; 376/136
(58) Field of Search ..................... 376/150, 134, 376/136; 427/587, 585

(56) References Cited

U.S. PATENT DOCUMENTS

| H984 | * | 11/1991 | Brooks et al. ........................ 376/146 |
|---|---|---|---|
| 3,663,273 | * | 5/1972 | Porter et al. ....................... 117/107.1 |
| 3,784,824 | * | 1/1974 | Reifenschweiler .................. 250/84.5 |
| 4,145,250 | * | 3/1979 | Ohkawa et al. ......................... 176/3 |
| 4,234,622 | * | 11/1980 | DuBuske et al. .................... 427/45.1 |
| 4,298,804 | * | 11/1981 | Colditz ................................ 376/108 |
| 4,555,275 | * | 11/1985 | Tobin ..................................... 148/63 |
| 4,619,807 | * | 10/1986 | Kotzlowski .......................... 376/136 |

(List continued on next page.)

FOREIGN PATENT DOCUMENTS

| 0098385 | * | 6/1985 | (JP) | ..................................... 376/136 |
|---|---|---|---|---|
| 4105096 | * | 4/1992 | (JP) | ..................................... 376/134 |

OTHER PUBLICATIONS

T. Kuroda et al., "ITER Plasma Facing Components", International Atomic Energy Agency, Vienna 1991, in ITER Documentation Series No. 30, pp. 18, 22, 33, 40.

ANL/FPP/TM–188, May 1984, Brooks et al(II) pp. 43–66.*

INTOR report "zero phase", IAEA, vienna,(1980) chapter XI, pp. 324–329.*

Conf: $9^{th}$ Symp. on Engineering Problems of Fusion Research. Chicago, IL., Oct. 1981, pp. 1597–1600, Morgan et al.*

ANL/EPP/TM–174, May 1983, Brooks et al (III), pp. 1–18.*

ANL/FPP/TM–246, Mar. 1990, Mattas, pp. 1–46.*

(List continued on next page.)

Primary Examiner—Harvey E. Behrend
(74) Attorney, Agent, or Firm—Sughrue, Mion, Zinn, Macpeak & Seas, PLLC

(57) ABSTRACT

In a plasma facing member exposed to a plasma beam of nuclear fusion reactors or the like, such as an electron beam, a tungsten layer is formed by the use of a CVD method and has a thickness of 500 micron meters or more. The tungsten layer may be overlaid on a substrate of molybdenum or tungsten and comprises included gases reduced to 2 ppm or less and impurities reduced to 2 ppm or less. The tungsten layer is specified by either a fine equi-axed grain structure or a columnar grain structure. Alternatively, the material of the substrate may be, for example, Cu alloy, stainless steel, Nb alloy, or V alloy.

2 Claims, 6 Drawing Sheets

U.S. PATENT DOCUMENTS

| | | | | |
|---|---|---|---|---|
| 4,721,595 | * | 1/1988 | Greenside et al. | 376/150 |
| 4,935,194 | * | 6/1990 | Verschoore | 376/108 |
| 5,081,069 | * | 1/1992 | Parker et al. | 427/235 |
| 5,182,075 | * | 1/1993 | Gotoh et al. | 376/150 |
| 5,260,106 | * | 11/1993 | Kawarada et al. | 427/577 |
| 5,342,660 | * | 8/1994 | Cann et al. | 427/577 |
| 5,390,217 | * | 2/1995 | Ioki et al. | 376/150 |
| 5,410,574 | * | 4/1995 | Masumoto et al. | 376/150 |
| 5,509,472 | * | 4/1996 | Tomura et al. | 165/171 |

OTHER PUBLICATIONS

Nuclear Technology/Fusion, vol. 4, Jul. 1983, pp. 33–45, Brooks.*

GA–A17266, Nov. 1983, Trester et al. (identified as pp. 1–6).*

ANL/FPP/TM–175, Jun. 1983, Brooks et al (IV), pp. 1–25.*

Nuclear Fusion, vol. 20, No. 10, (1980), pp. 1335–1340, clausing.*

Thin Films Science and Technology s7, Tihn Films by Chemical Vapour Deposition, Elsevier, Amsterdam, (1990), by C.E. Morosanu, pp. 31–70.*

Proc. $4^{th}$ European Conf. on Chemical Vapour Depositions, (1983) pp. 340–349, "CVD Coatings in Fusion Reactor Technology", Brossa.*

* cited by examiner

W(B) 1100° C

W(B) 240° C

W(C) 140° C

W(C) 980° C

FINE EQUI-AXED CRYSTAL GRAINS

→ GROWTH DIRECTION

COLUMNAR CRYSTAL GRAINS

↑ GROWTH DIRECTION

PLASMA FACING COMPONENTS OF NUCLEAR FUSION REACTORS EMPLOYING TUNGSTEN MATERIALS

BACKGROUND OF THE INVENTION

This invention relates to a plasma facing component, namely, a plasma facing member to be exposed to plasma and, in particular, to a plasma facing member which is capable of withstanding plasma of a very high temperature in nuclear fusion reactors or the like.

In general, such a plasma facing member is located in nuclear fusion reactors or the like to guide or stop plasma of a very high temperature and is therefore inevitably exposed to the plasma.

Herein, it is to be noted that the plasma facing member is estimated by a loss which occurs on plasma radiation and which will be referred to as a plasma radiation loss. Specifically, the plasma facing member preferably has a low or reduced plasma radiation loss. Since the plasma radiation loss results from an impurity included in the plasma facing member, it is necessary to reduce an amount of the impurity in a material of the plasma facing member. The material of the plasma facing member will be called herein under a plasma facing material which includes Cu alloy, stainless steel, Nb alloy, V alloy, etc.

On the other hand, a low-Z material is known as a material which has a highly acceptable impurity concentration and has been therefore used as the plasma facing material. From this viewpoint, the low-Z material has been usually used as the plasma facing material.

Moreover, the plasma facing material must be strong against a thermal shock and must exhibit a high melting point, a low vaporization pressure, a high thermal conductivity, and a high mechanical strength. In addition, it is also required that the plasma facing material is rarely eroded for reducing the plasma radiation and is effective to recycle hydrogen which is used as fuel in nuclear fusion reactors or the like. This means that the plasma facing material preferably scarcely absorbs hydrogen.

Taking the above into account, graphite which has the atomic number of 6 and the low-Z material has been conventionally mainly used as the plasma facing material because the graphite has excellent thermal and mechanical stability and is stable even at a high temperature.

In the meanwhile, the graphite is disadvantageous in that a comparatively large amount of gas is discharged because the graphite is porous. In addition, erosion easily takes place in the plasma facing member of the graphite by ion sputtering due to radiation and by sublimation caused by plasma radiation. Especially, cracks appear in a large size of a tokamak device even when isotropic graphite is used.

In order to improve the above-mentioned disadvantages of the graphite, recent attention has been directed to tungsten as a candidate of the plasma facing material because tungsten has a high melting point and a low sputtering characteristic and is consequently small in gas discharge and in erosion. Such a plasma facing member of tungsten has been proposed in a paper which is contributed by T. Kuroda et al on International Atomic Energy Agency VIENNA 1991 and which is entitled "ITER PLASMA FACING COMPONENTS" in ITER DOCUMENTATION SERIES NO. 30.

As a rule, such a plasma facing member of tungsten is manufactured by refining tungsten by a powder-metallurgical method. It is noted that, on refining tungsten by the powder-metallurgical method, a gas component inevitably remains in the order of several tens of ppm in the refined tungsten together with alkali metal components of a low fusion point. The alkali components fall in the order from 0.2 ppm to several ppm within the refined tungsten. Moreover, an impurity, such as iron, which renders a grain boundary fragile is inescapably included in the tungsten.

On the other hand, a tungsten layer can be deposited by the use of a chemical vapor deposition (CVD) technique, as known in the art. However, consideration has not been made yet about manufacturing the plasma facing member by application of the CVD technique.

SUMMARY OF THE INVENTION

It is an object of this invention to provide a plasma facing member which is very strong against a thermal shock and can therefore withstand plasma radiation of a high temperature.

It is another object of this invention to provide a plasma facing member of the type described, which is small in gas discharge and erosion.

A plasma facing member to which this invention is applicable is to be exposed to plasma. According to an aspect of this invention, the plasma facing member has a surface layer which is to be faced with plasma and which is formed by a tungsten layer deposited by chemical vapor deposition (CVD) to a thickness not thinner than 500 micron meters.

According to another aspect of this invention, the plasma facing member comprises a support or a substrate attached to the tungsten layer for supporting the tungsten layer.

Thus, the tungsten layer deposited by the CVD has a metallographic structure formed by either a fine equi-axed crystal structure or a columnar crystal structure. It has been confirmed that such a metallographic structure makes erosion extremely small.

DESCRIPTION OF THE PREFERRED EMBODIMENTS

Figure 1:
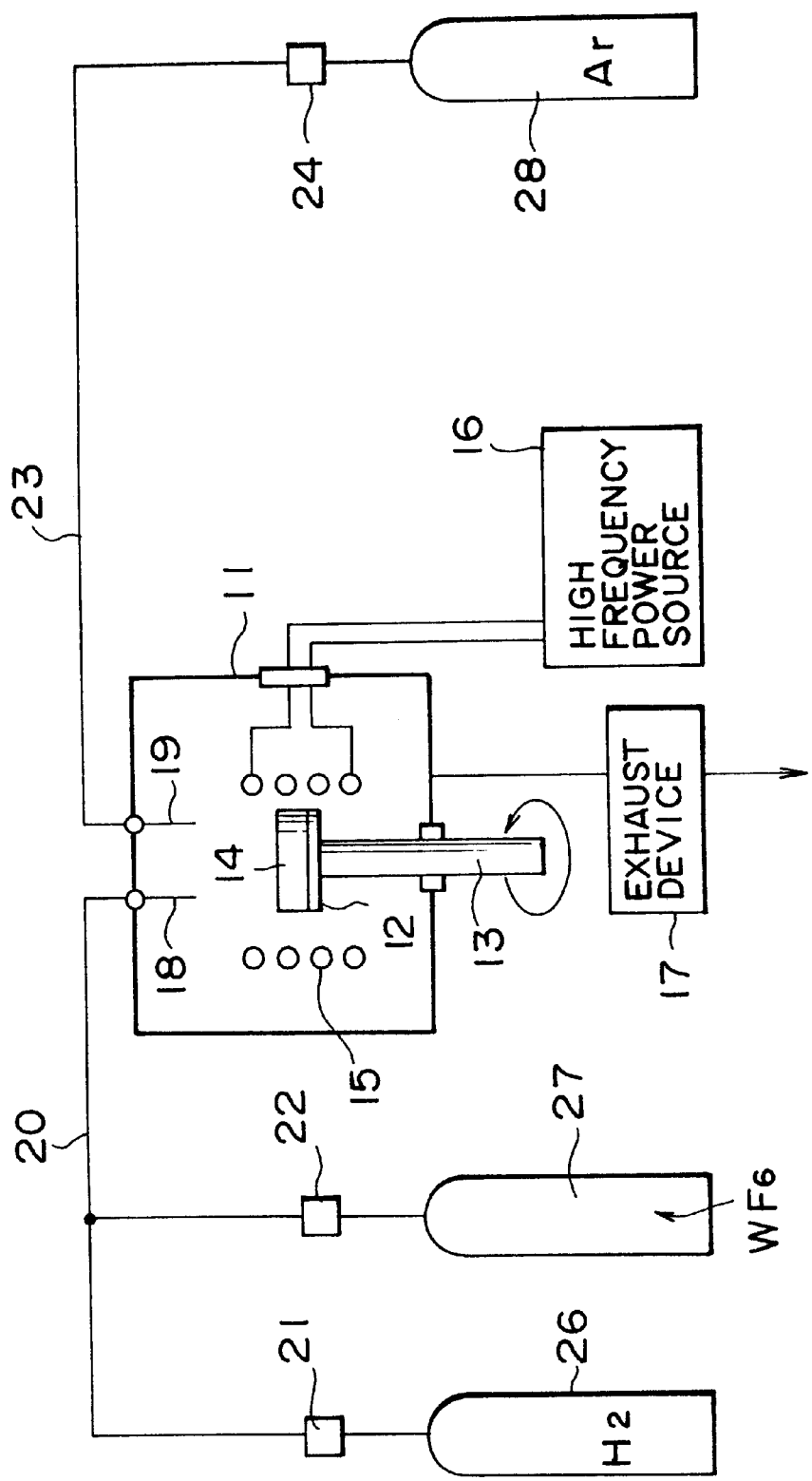
FIG. 1 shows a block diagram of an apparatus which is used for manufacturing a plasma facing member according to this invention.

Referring to FIG. 1, an apparatus is used for manufacturing a plasma facing member according to this invention.

Briefly, the plasma facing member is manufactured by a chemical vapor deposition (CVD) method which is carried out by the use of the illustrated apparatus.

More specifically, the apparatus comprises a reaction chamber 11 which defines a hollow space therein. A table 12 is located in the reaction chamber 11 and is supported by a rotatable axis 13 which is rotatable by a motor or the like (not shown) placed outside of the reaction chamber 11. On the table 12, a substrate 14 of, for example, molybdenum is sustained as a specimen to be processed by the CVD method. The substrate 14 and the table 12 are surrounded by a heater 15 which is electrically connected through an insulator (unnumbered) to a high frequency power source 16 located outside of the reaction chamber 11.

In addition, an exhaust device 17, such as a vacuum pump, is coupled to the reaction chamber 11 to exhaust a gas from the reaction chamber 11. Over the substrate, a first gas supply nozzle 18 and a second gas supply nozzle 19 are attached to the reaction chamber 11. Although not shown in FIG. 1, the first gas supply nozzle 18 has two gas injection holes each of which has a diameter of 2 mm and which is spaced apart from each other.

The first gas supply nozzle 18 is coupled through a gas conduit 20 to first and second valves 21 and 22 while the second gas supply nozzle 19 is coupled through a second gas conduit 23 to a third valve 24. In the illustrated example, the first and the second valves 21 and 22 are connected to first and second reservoirs or bombs 26 and 27 for storing hydrogen and $WF_6$, respectively, while the third valve 24 is connected to a third reservoir 28 for storing argon (Ar).

With this structure, the reaction chamber 11 is at first exhausted by the exhaust device 17 to lower a pressure in the hollow space. Subsequently, when the first valve 21 is opened, a hydrogen gas ($H_2$) is supplied through the first gas conduit 20 and the first gas supply nozzle 18 to be introduced into the reaction chamber 11. As a result, the reaction chamber 11 is filled with the hydrogen gas to a predetermined pressure which may be, for example, a pressure between 1 and 20 Torr. Simultaneously, the substrate 13 is heated to a temperature of 700 degrees by the heater 15 driven by the high frequency power source 16.

Thereafter, the second valve 22 is opened to supply a $WF_6$ gas to the first gas conduit 20. Consequently, the hydrogen gas ($H_2$) and the $WF_6$ gas are mixed with each other into a mixed gas. The mixed gas is introduced through the first gas conduit 20 and the first gas supply nozzle 18 to the reaction chamber 11. In this event, the mixed gas is controlled so that a ratio of the $WF_6$ gas to the $H_2$ gas becomes equal to 1:5.

While the mixed gas is being introduced into the reaction chamber 11 at the above-mentioned ratio and flow rate, the substrate 14 is rotated together with the table 12 and the rotation axis 13 at a rotation speed of 12 turns/minute.

As a result, a tungsten (W) layer is deposited on the substrate 13 at a uniform deposition rate of 360 micron meters/hour to a thickness of 2.5 millimeters. Thus, a deposited plate is manufactured in the reaction chamber 11 by the CVD method and has the substrate of molybdenum and the tungsten layer of 2.5 millimeters thick. During the deposition of the tungsten layer, the pressure of the reaction chamber 11 is kept at 1.3 kPa.

After completion of the deposition of the tungsten layer, the second valve 22 is closed with the first valve 21 opened. In this situation, the hydrogen gas alone is introduced into the reaction chamber 11. Subsequently, the first valve 21 is closed while the third valve 24 is opened to introduce the argon (Ar) gas into the reaction chamber 11 through the second gas conduit 23 and the second gas supply nozzle 19.

When the argon gas is filled in the reaction chamber 11, the deposited plate is taken out of the reaction chamber 11 and is cut by a wire discharge saw into a plurality of plasma facing members which will be called first specimens specified by W(1).

Next, the tungsten layer of each plasma facing member has been observed about a metallurgical structure. As a result of the observation, it has been found out that most of grains had diameters of 0.5 micron meter or less and a fine equi-axed grain structure has been formed.

Figure 2:
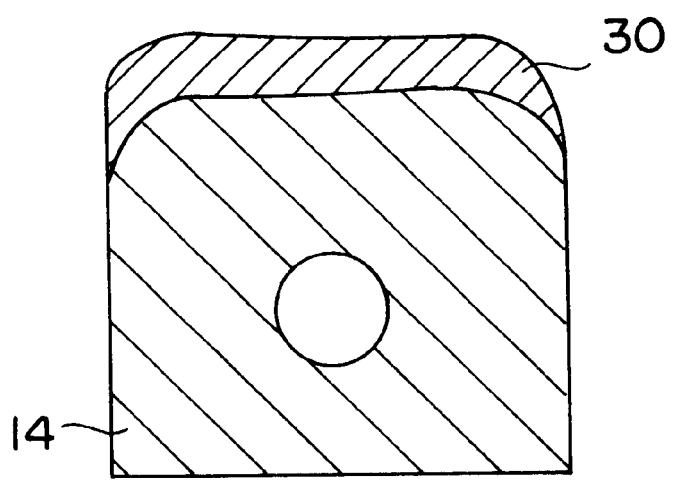
FIG. 2 shows a sectional view of the plasma facing member according to an embodiment of this invention.

Referring to FIG. 2, a plasma facing member is exemplified so as to facilitate an understanding of this invention. As shown in FIG. 2, the plasma facing member has the substrate 14 of molybdenum and the tungsten layer 30 deposited on the substrate 14 by the CVD method mentioned above. In the illustrated example, the substrate 14 has a rectangular shape having two rounded corners and two angular corners. The two rounded corners directed upwards of FIG. 2 may have different radii of curvature. In addition, an opening is formed at a center of the substrate 14 and serves to allow a coolant, such as water, to pass therethrough.

In addition, the tungsten layer 30 is deposited on the substrate 14 so that the two rounded corners are covered by the tungsten layer 30.

Herein, a plurality of tungsten plates have been manufactured by a powder-metallurgical method merely for comparison. In this case, the tungsten plates have been press-rolled and might be named first comparison specimens which will be depicted at W(A) herein under.

Under the circumstances, comparison between the first specimens and the first comparison specimens W(A) has been made as regards amounts of included gases and amounts of impurities. The results of the comparison have been tabulated in Table 1.

TABLE 1

| | | Amounts of Impurities | |
|---|---|---|---|
| VMT:ppb | | CVD Method | Power-metallurgical Method |
| Gases | H | 110 | 300 |
| | C | 130 | 430 |
| | N | 25 | 0.5 ppm |
| | O | 65 | 30 ppm |
| | F | 310 | ND(< 8) |
| | Cl | 34 | 9 |
| Metals | Li | ND(< 1) | ND(< 2) |
| | Na | 11 | 240 |
| | Mg | ND(< 1) | 4 |
| | Al | ND(< 1) | 2600 |
| | Si | ND(< 1) | 1000 |
| | K | ND(< 5) | ND(< 7) |
| | Ca | ND(< 40) | 1800 |
| | Ti | ND(< 1) | 120 |
| | Cr | ND(< 1) | 520 |
| | Mn | ND(< 1) | 110 |
| | Fe | 47 | 4600 |
| | Ni | ND(< 1) | 440 |
| | Cu | ND(< 1) | 54 |
| | Mo | ND(< 4) | 160 |
| | Sn | ND(< 10) | 190 |
| | Th | ND(< 0.01) | ND(< 1) |
| | U | ND(< 0.01) | ND(< 1) |
| W (%) | | 99.99998 | 99.9988 |

In Table 1, the hydrogen gas ($H_2$) has been measured by a combustion method while the nitrogen gas and the oxygen gas have been measured by a thermal conduction method and an infrared-absorbing analysis method, respectively. The other elements have been measured by a mass spectrometry using glow discharge.

From Table 1, it is readily understood that the first specimens are extremely small in included gases and impurities as compared with the first comparison specimens.

Further, graphite specimens (depicted at Gr) and second comparison specimens (depicted at W(B)) have been prepared along with the first specimens W(1) and the first comparison specimens W(A) to estimate erosion against an electron beam. In this event, the second comparison specimens W(B) have been formed by tungsten plates obtained through a single crystallization process and a second recrystallization process while the graphite specimens Gr have been formed by graphite and carbon fiber reinforced carbon (CFC) materials. The erosion has been estimated by measuring a depth of erosion after heating each specimen with the electron beam. The results of estimation are shown in Table 2.

TABLE 2

|      | RADIATION TIME | RADIATION TEMPERATURE | DEPTH OF EROSION ($\mu$m) |
|------|----------------|----------------------|---------------------------|
| Gr.  | 2.0 ms         | 100° C.              | 9.8                       |
|      |                | 960                  | 22.8                      |
| W(A) | 2.0            | 150                  | 1.3                       |
|      |                | 1100                 | 2.3                       |
| W(B) | 2.0            | 240                  | 2.1                       |
|      |                | 1100                 | 2.3                       |
| W(1) | 2.0            | 140                  | 0.7                       |
|      |                | 980                  | 1.3                       |

In Table 2, the electron beam had a heat flux of 1500·MW/m$^2$ (70 keV, 4 A) and heated specimens for a heating duration of 2.0 milliseconds. The first comparison specimens W(A), the second comparison specimens W(B), and the first specimens W(1) had sizes of 30×30×5 (mm), 25×25×2 (mm), and 16×16×2 (mm), respectively. From Table 2, it is apparent that the first specimens W(1) are extremely small in depth of erosion in comparison with the other comparison specimens W(A) and W(B).

Figure 3:
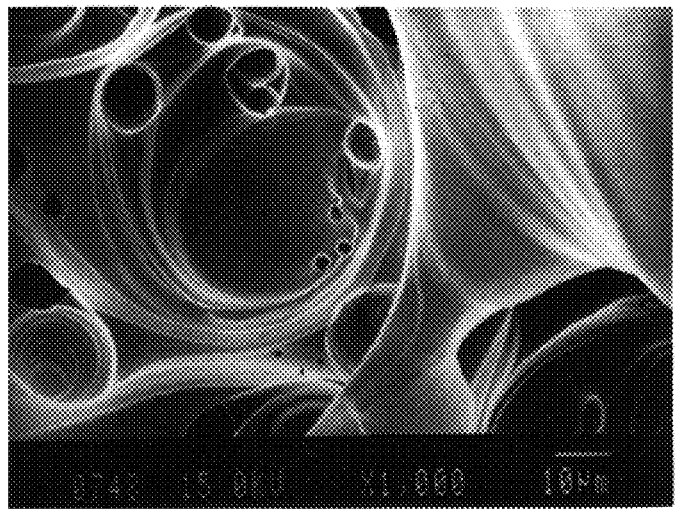
FIG. 3 is a microphotograph for showing a metallographic structure of a conventional plasma facing member that appears at a temperature of 1100° C.
Figure 4:
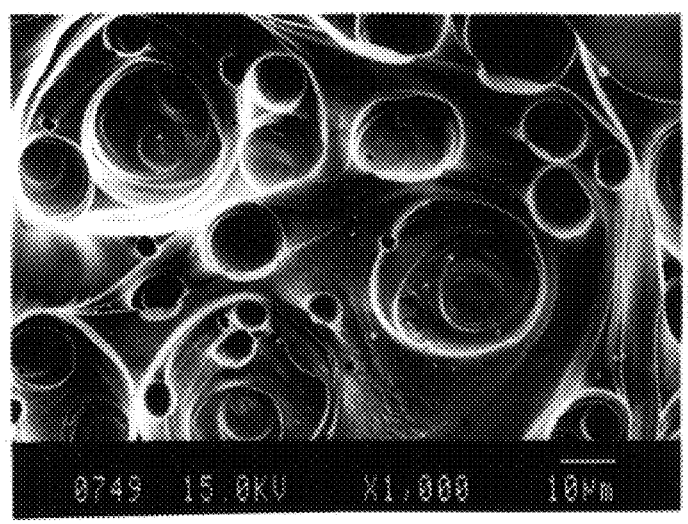
FIG. 4 is a microphotograph for showing a metallographic structure of the conventional plasma facing member that appears at a temperature different from 1100° C.

Referring to FIGS. 3 and 4, heated portions of the second comparison specimens W(B) are shown which have metallographic structures on each surface of the heated portions. In FIG. 3, the heated portion of the second comparison specimen is heated by the electron beam to a temperature of 1100° C. while the heated portion of the second comparison specimen is heated by the electron beam to a temperature of 240° C. in FIG. 4. At any rate, serious disruptions take place on the heated portions of the second comparison specimens W(B).

Figure 5A:
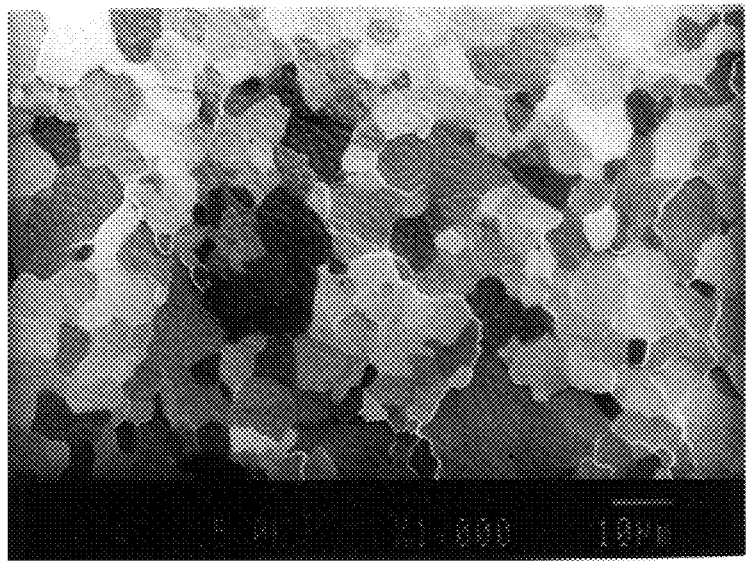
FIGS. 5(A) and (B) are microphotographs for showing metallographic structures of plasma facing members according to an embodiment of this invention.
Figure 5B:
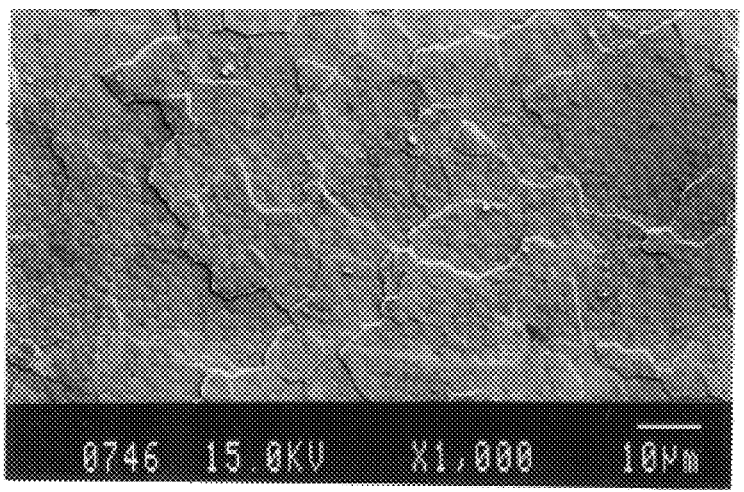

Referring to FIGS. 5(A) and (B), heated portions of the first specimen W(1) are shown which have metallographic structures on surfaces of the heated portions. In FIGS. 5(A) and (B), the heated portion of the first specimen is heated by the electron beam to a temperature of 140° C. and 980° C., respectively. As is readily understood from FIGS. 5(A) and (B), grain boundaries are left on the surfaces of the heated portions and no disruption takes place on the surfaces of the heated portions. In addition, it is noted in FIGS. 5(A) and (B) that the heated portions are not molten by the heating of the electron beam.

Alternatively, second specimens have been prepared by the use of the apparatus illustrated in FIG. 1. In this event, the first gas nozzle 18 had a single injection hole of 7.5 mm in diameter. The other conditions were kept unchanged. Under the circumstances, a tungsten layer was deposited on the molybdenum plate 14 at a deposition rate of 200 micron meters/hour.

After the deposition of the tungsten layer, the molybdenum plate 14 was mechanically or chemically removed from the tungsten plate and, as a result, specimens were formed which were composed of the tungsten layer alone and which will be called second specimens W(2) or second CVD-W specimens. Like in the first specimens, metallographic structures of the second specimens have been measured by the use of a microscope and have been found to be columnar structures.

Figure 6A:
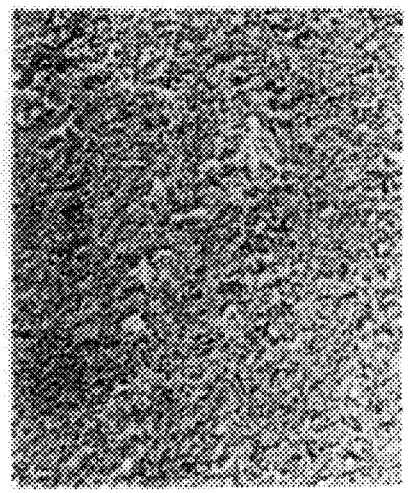
FIGS. 6(A) and 6(B) are microphotographs for showing crystals which occur in the plasma facing members according to this invention, respectively.

In FIG. 6(A), the first specimen W(1) is composed of fine equi-axed crystal grains stacked along a growth direction of the crystals. On the other hand, FIG. 6(B) shows that the second specimen W(2) is composed of columnar crystal grains extended along the growth direction of the crystals.

Figure 6B:

Although the second specimen has a metal-lographic structure different from that of the first specimen, as shown in FIGS. 6(A) and 6(B), it has been found out that the second specimen is similar in included gases, impurities, and erosion to the first specimen.

Furthermore, a bending test has been carried out as regards the first specimen W(1), the second specimen W(2), and the first comparison specimen W(A).

Figure 7:
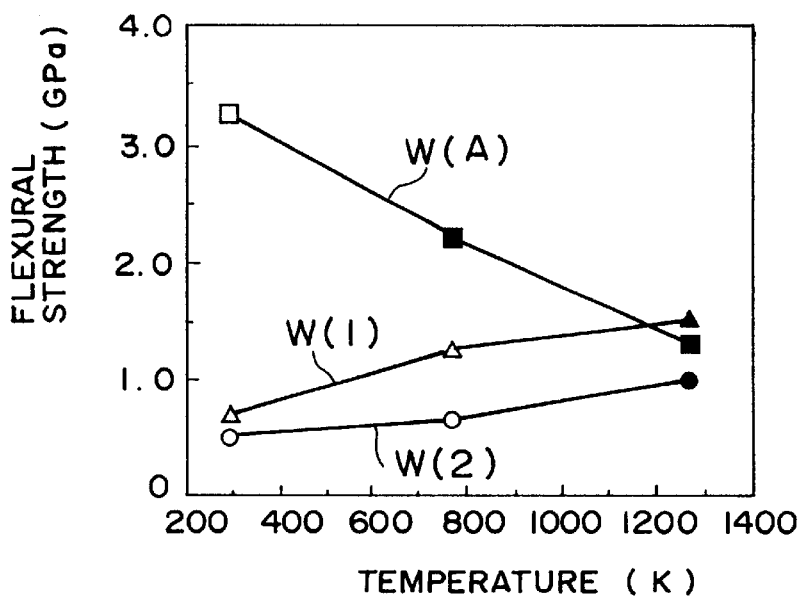
FIG. 7 is a graphical representation for describing results of a bending test which is carried out in connection with the plasma facing members according to this invention and the conventional plasma facing member.

Referring to FIG. 7, the results of the bending test are shown by curves W(1), W(2), and W(A) which correspond to the specimens W(1), W(2), and W(A), respectively, and which represent relationships between temperatures (K) and flexural strength (GPa). In FIG. 7, it is noted that white circles, triangles, and squares show that breakage occurs at a bending angle less than 10 degrees while black circles, triangles, and squares show that no breakage occurs even at a bending angle greater than 50 degrees.

From FIG. 7, it is apparent that flexural strength is not reduced in both of the first and the second specimens W(1) and W(2) even when a temperature is raised up.

In addition, average thermal expansion coefficients and thermal conductivities have been measured as regards the first and the second specimens W(1) and W(2) and the second comparison specimens W(B). On measuring the average thermal expansion coefficients, the thermal expansion coefficients have been measured at each temperature range between 20° C. and each of 100 through 900° C. to obtain measured results within the respective temperature ranges. The measured results have been averaged within each temperature range. On the other hand, a laser flash method has been used to measure the thermal conductivities. The measured results are shown in Tables 3 and 4.

TABLE 3

Average Thermal Expansion Coefficients From 20° C. ($10^{-6}$/° C.)

| (° C.)  | W(1) | W(2) | W(B) |
|---------|------|------|------|
| 20–100  | 4.1  | 4.3  | 3.9  |
| 20–200  | 4.4  | 4.4  | 4.4  |
| 20–300  | 4.5  | 4.5  | 4.5  |
| 20–400  | 4.6  | 4.5  | 4.5  |
| 20–500  | 4.6  | 4.5  | 4.6  |
| 20–600  | 4.7  | 4.5  | 4.7  |
| 20–700  | 4.7  | 4.5  | 4.9  |
| 20–800  | 4.8  | 4.4  | 5.0  |
| 20–900  | 4.9  | 4.5  | 5.1  |

TABLE 4

| (° C.) | Thermal Conductivity | | |
|---|---|---|---|
| | W(1) | W(2) | W(B) |
| 20 | 0.410 | 0.415 | 0.444 |
| 200 | 0.373 | — | 0.378 |
| 400 | 0.326 | 0.335 | 0.347 |
| 600 | 0.308 | — | 0.322 |
| 800 | 0.303 | 0.307 | 0.314 |
| 1000 | 0.295 | — | 0.303 |
| 1200 | 0.285 | 0.281 | 0.300 |
| 1300 | 0.274 | — | 0.296 |

In FIG. 1, it is possible to reduce a total amount of gas components to 2 ppm or less by controlling an amount of the $WF_6$ gas supplied to the plate 14. Moreover, the total amount of the gas components have been found to be reduced to 1.5 ppm or less by changing various conditions mentioned in connection with FIG. 1.

In addition, it is possible to reduce a total amount of metal impurities to 2 ppm or less and to consequently obtain the tungsten layer which has a purity of tungsten very close to 99.99999%. Thus, the tungsten layer deposited by the CVD method has an extremely high purity as compared with the tungsten layer formed by the powder metallurgical method and can therefore drastically reduce low vapor pressure components which remains by a powder metallurgical method.

As shown in FIG. 7, the first specimens have the fine equi-axed grain structure and exhibit the flexural strength which becomes strong as the temperature is raised up. In this event, the grain size may fall within a range between 0.05 and 5.00 micron meters.

Figure 8:
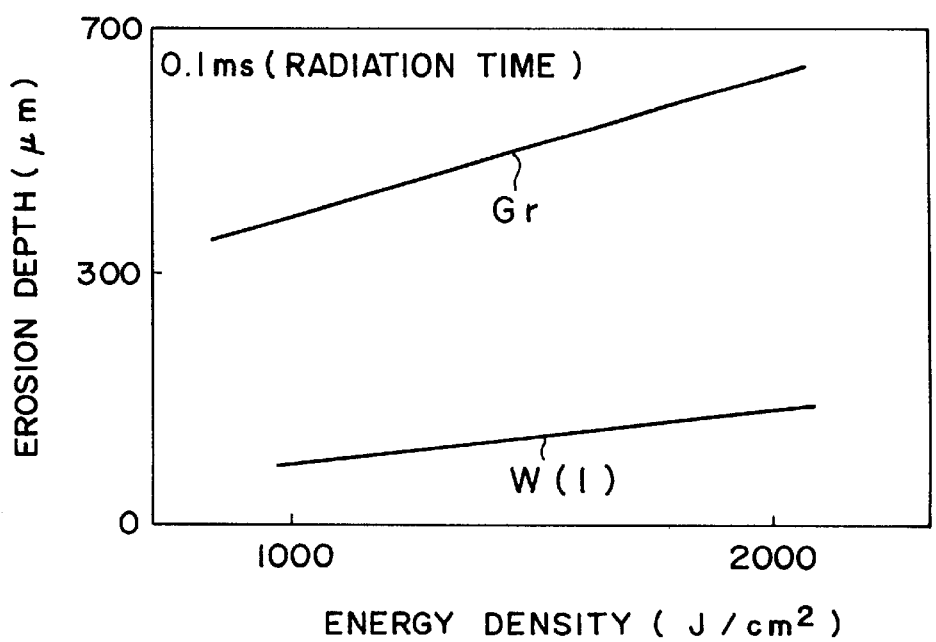
FIG. 8 is another graphical representation for describing erosion depths of the conventional plasma facing member and the plasma facing member according to this invention.

Referring to FIG. 8, comparison of erosion has been made between the first specimen W(1) and the graphite specimen (Gr). To this end, a relationship between energy density $(J/cm^2)$ and an erosion depth or depth of erosion is shown in connection with W(1), and Gr in FIG. 8. Specifically, the electron beam of high energy density heated each specimen to measure the erosion depth on each specimen. As shown in FIG. 8, the erosion depth in the first specimen W(1) is nearly one third of the erosion depth in the graphite specimen Gr at 100° C. or so and one sixth of the erosion depth in the latter at 1000° C. From this fact, it is readily understood that the tungsten layer deposited by the CVD method is excellent in thermal stability and withstands erosion, as compared with the plasma facing member of tungsten manufactured by the powder metallurgical method. This shows that the tungsten layer according to this invention would be very desirable as the plasma facing member in nuclear fusion reactors or the like. Especially, when the tungsten layer is several millimeters thick or more, the thermal stability and the like are remarkably improved in the plasma facing member according to this invention. Practically, when the tungsten layer deposited by the CVD method has a thickness less than 500 micron meters, it has been confirmed that the tungsten layer is weak against the thermal shock and is not suitable for the plasma facing member.

While this invention has thus far been described in conjunction with a few embodiments thereof, it will be readily possible for those skilled in the art to put this invention into practice in various other manners. For example, the substrate of the plasma facing member may be formed by tungsten, Cu alloy, stainless steel, Nb alloy, v alloy, etc.

What is claimed is:

1. A method of forming a plasma facing surface on a substrate formed of predetermined material by chemical vapor deposition in a reaction chamber, said method comprising:

uniformly depositing, on the substrate, a tungsten layer at a deposition rate of 360 µm/hour to a thickness of 2.5 mm by heating the substrate to a predetermined temperature, rotating the substrate at a predetermined speed, supplying a hydrogen gas and a $WF_6$ gas into the reaction chamber to form a mixture of the hydrogen gas and the $WF_6$ gas having a ratio of the $WF_6$ gas to the hydrogen gas of 1:5 to maintain a pressure of the reaction chamber at 1.3 kPa, and causing the mixed hydrogen and $WF_6$ to flow at a predetermined flow rate.

2. A method as claimed in claim 1, wherein the predetermined material of the substrate is one material selected from a group consisting of molybdenum, tungsten, Cu alloy, stainless steel, Nb alloy, and V alloy.

* * * * *